(12) United States Patent
Steinweg et al.

(10) Patent No.: US 10,318,772 B1
(45) Date of Patent: Jun. 11, 2019

(54) MONITORING OF MOTOR CONTROL CENTER ASSETS

(71) Applicant: ROCKWELL AUTOMATION TECHNOLOGIES, INC., Mayfield Heights, OH (US)

(72) Inventors: Calvin C. Steinweg, Milwaukee, WI (US); Scott D. Day, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/938,643

(22) Filed: Mar. 28, 2018

(51) Int. Cl.
*G06F 17/00* (2019.01)
*G06K 7/10* (2006.01)
*G06K 19/07* (2006.01)

(52) U.S. Cl.
CPC ..... *G06K 7/10366* (2013.01); *G06K 19/0723* (2013.01)

(58) Field of Classification Search
USPC .................................................. 235/375–385
See application file for complete search history.

(56) References Cited

U.S. PATENT DOCUMENTS

2014/0209676 A1* 7/2014 Reynolds ............. G06Q 10/087
235/385

* cited by examiner

*Primary Examiner* — Jamara A Franklin
(74) *Attorney, Agent, or Firm* — Fletcher Yoder, P.C.

(57) ABSTRACT

Motor control center components are tagged and monitored to produce accurate information on the location and identification of the components in closed and sealed motor control center bays, sections, and enclosures. Wireless polling signals may allow for locating the tagged components, and the tags may store or access component-identifying data and, where desired, condition data for the component or its environment in the motor control center. The data may be collected wirelessly and made available to local or remote monitoring equipment, controllers, workstations, human machine interfaces, and so forth.

20 Claims, 7 Drawing Sheets

US 10,318,772 B1

MONITORING OF MOTOR CONTROL CENTER ASSETS

BACKGROUND

The invention relates generally to detection and monitoring of component assets of motor control centers.

Motor control centers (MCC's) are often key elements in many types of automation processes, particularly factory automation. Among the many types of actuators in such environments, the most important and ubiquitous is the electric motor. Motors, particularly three-phase induction motors, drive pumps, conveyors, fans, assembly lines, and many other machines. The proper control of such motors, through application of conditioned power and the feedback of sensed process data is fundamental to most automation applications.

In many applications the components used to condition and apply power to electric motors are grouped in an MCC. These typically include dedicated locations, drawers, bays, and "buckets" that support the components, with data and power wiring routed through wireways to each location. The locations are covered by a door that remains closed (and typically sealed) during normal operation. Power, often three-phase power, is provided in a backplane via power busses that are coupled to the power components via plug-in arrangements. The components of such MCC's may include, for example, circuit protective devices (e.g., fuses, circuit breakers, safety relays, etc.), switching devices (e.g., contactors, relays, disconnects, etc.), control devices (e.g., motor drives, programmable control devices, etc.), sensors and sensor interfaces (e.g., input/output or "I/O" devices), and a range of monitoring, control, and reporting devices (e.g., push buttons, human machine interfaces or "HMI's", indicator lights, etc.).

Access to the interior volumes of MCC's where such components are disposed and interconnected is purposefully limited and controlled. Service personnel and technicians must follow strict procedures for opening and interacting with the components, and often don special gear or suits before doing so. In some cases, this makes physical examination of the components relatively uncommon except in case some unusual condition is detected or suspected. During normal operation, the actual condition of the components may not be directly available. Moreover, while "as built" drawings may be available when the equipment is initially commissioned, in some cases the components are replace, changed, or moved, and service and plant personnel may not have diagrams or information on exactly what components are installed and active, or at what location the components may be accessed in case of need.

There is a need, therefore, for improved techniques for determining what components are present and active in MCC's, and for monitoring their operative states.

BRIEF DESCRIPTION

The present disclosure provides technology designed to respond to such needs. In accordance with a first aspect, a motor control center system comprises an enclosure having multiple internal units covered by one or more doors, and automation components located and interconnected in the internal units and provided with power and data connections for receiving input power and providing output power to one or more motors. A polling system is disposed in the enclosure and configured to output polling signals. A plurality of asset tags are associated with the automation components and are responsive to the polling signals, each asset tag storing data indicative of the respective associated automation component, the asset tags being configured to output component data signals indicative of the stored data and location data derived from the polling signals. A receiver, in operation, receives the component data signals from the asset tags.

In accordance with another aspect of the disclosure, a motor control center system comprises an enclosure having multiple internal units covered by one or more doors, and automation components located and interconnected in the internal units and provided with power and data connections for receiving input power and providing output power to one or more motors. A wireless polling system is disposed in the enclosure and configured to output polling signals corresponding to locations within the enclosure. A plurality of wireless asset tags are associated with the automation components and are responsive to the polling signals, each asset tag storing data indicative of the respective associated automation component, the asset tags being configured to wirelessly output component data signals indicative of the stored data and location data derived from the polling signals. A wireless receiver is disposed outside the enclosure that, in operation, receives the output component data signals from the asset tags and provides the component data or data derived from the component data to a remote monitoring system via a network.

In accordance with yet another aspect of the disclosure, a motor control center method comprises wirelessly outputting polling signals corresponding to locations within a motor control center enclosure, the enclosure having multiple internal units covered by one or more doors and automation components located and interconnected in the internal units and provided with power and data connections for receiving input power and providing output power to one or more motors, the automation components being associated with respective wireless asset tags associated with the respective automation components and responsive to the polling signals. In response to the polling signals, component data signals are wirelessly output from the wireless asset tags, the component data signals being indicative of the stored data and location data derived from the polling signals. The output component data signals are wirelessly received via a receiver disposed outside the enclosure, and the component data or data derived from the component data is provided to a remote monitoring system via a network.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described below, the present disclosure relates to a method of using wireless (e.g, radiofrequency identification, or "RFID" and infrared, or "IR"-enabled) technology to uniquely identify, locate, and monitor components in an MCC, as well as their location, and where desired, their operating state, environment, and so forth. In certain embodiments, RFID asset tags (active and/or passive) with readers are affixed to every unit that could be mounted into the MCC, and IR transmitters and associated tags identify each mounting location within the MCC infrastructure. When a unit is installed in the MCC, the IR-enabled tag reads its present location based on IR polling signals, and along with any programmed data, the RFID tag transmits its identity and location information back to a wireless transceiver, which may be located outside the MCC. This RFID transceiver is then connected to a network for relaying the data back to the plant monitoring system. Such monitoring of MCC assets in real or near-real time provides the ability to know where all MCC assets are located and even the environmental conditions surrounding each asset. Advantageously, such monitoring can be done in power environments in which the MCC enclosure is sealed and access is limited due to the nature of the power components. Moreover, identifying and locating specific units for preventative maintenance or replacement upon occurrence of unwanted conditions or failure is possible without relying on static drawings. Thus, for MCC's in which units may be replaced or moved, accurate location and monitoring is possible. Moreover, condition monitoring may be provided, including the ability to issue warnings if the asset is operating abnormally or in environmental conditions that warrant attention.

Figure 1:
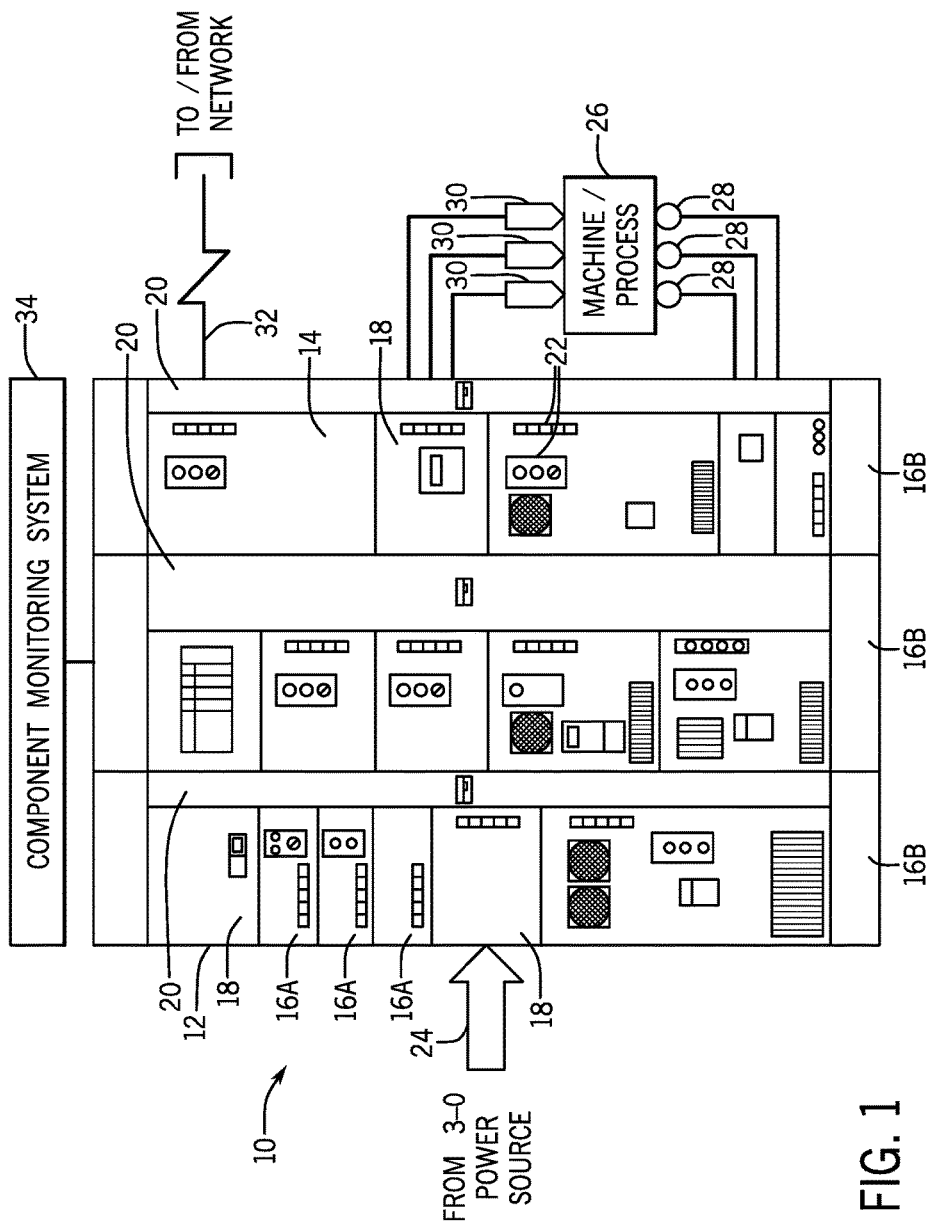
FIG. 1 is a diagrammatical representation of an example MCC in accordance with the present disclosure, shown receiving power from a source, and providing controlled power to electric motors, and data to remote monitoring equipment via a network.

FIG. 1 represents example MCC system 10 equipped to allow for detection and monitoring of system components without opening a power enclosure in which the components are active during use. The system comprises and MCC 12, though other systems may include any number of MCC's. The MCC itself is provided in an enclosure 14 which will typically be a sealed metal cabinet having a series of bays or locations 16A in a series of sections 16B. Each location will typically be accessible by a door 18 which is closed and sealed during use. Wireways 20 run along size and/or the top and bottom of the enclosure to allow for data and power wiring to be routed to and from the components disposed in the bays. Such wiring will often include both three-phase power wiring, single-phase wiring for certain components, data or network cabling, and so forth. Certain elements or components of the MCC may be visible and accessible from outside the enclosure, such as mounted on the doors. Such externally accessible components 22 may include, for example, pushbuttons, manual switches, meters, indicator lights, and so forth.

When placed in service, the MCC will be coupled to receive incoming power as indicated by reference numeral 24. As may be appreciated by those skilled in the art, the power is typically routed through horizontal bus bars that are connected to a series of vertical bus bars that are separated from one another to allow three phase power to be applied to each MCC section 16B. The bus bars may be isolated from the bays by partitions or other structures within the enclosure. In service, the MCC is coupled to and controls application of power to a machine or process 26, such as an industrial automation application. The power is applied to one or more actuators 28, typically electric motors (e.g., three-phase induction motors). Moreover, control by components of the MCC may be based upon feedback from sensors 30 associated with the machine or process. A wide variety of such sensors may be utilized, such as position sensors, speed sensors, counters, temperature and flow sensors, and so forth. Though not separately shown, control signals and feedback may also be provided by automation controllers, remote control systems, manual inputs, human machine interfaces, and so forth.

In accordance with the present technologies, the MCC may be coupled to a network 32 to provide data regarding operation of the components and the machine or process. The network may also be used to receive commands, settings, configurations, and other data from one or more sources both local to the MCC and remote. Moreover, a component monitoring system 34 is illustrated diagrammatically and will be described in greater detail below. In general, the monitoring allows for detection of the location and identification of the components within the enclosure of the MCC without requiring access to the inner volume of the enclosure and during use.

Figure 2:
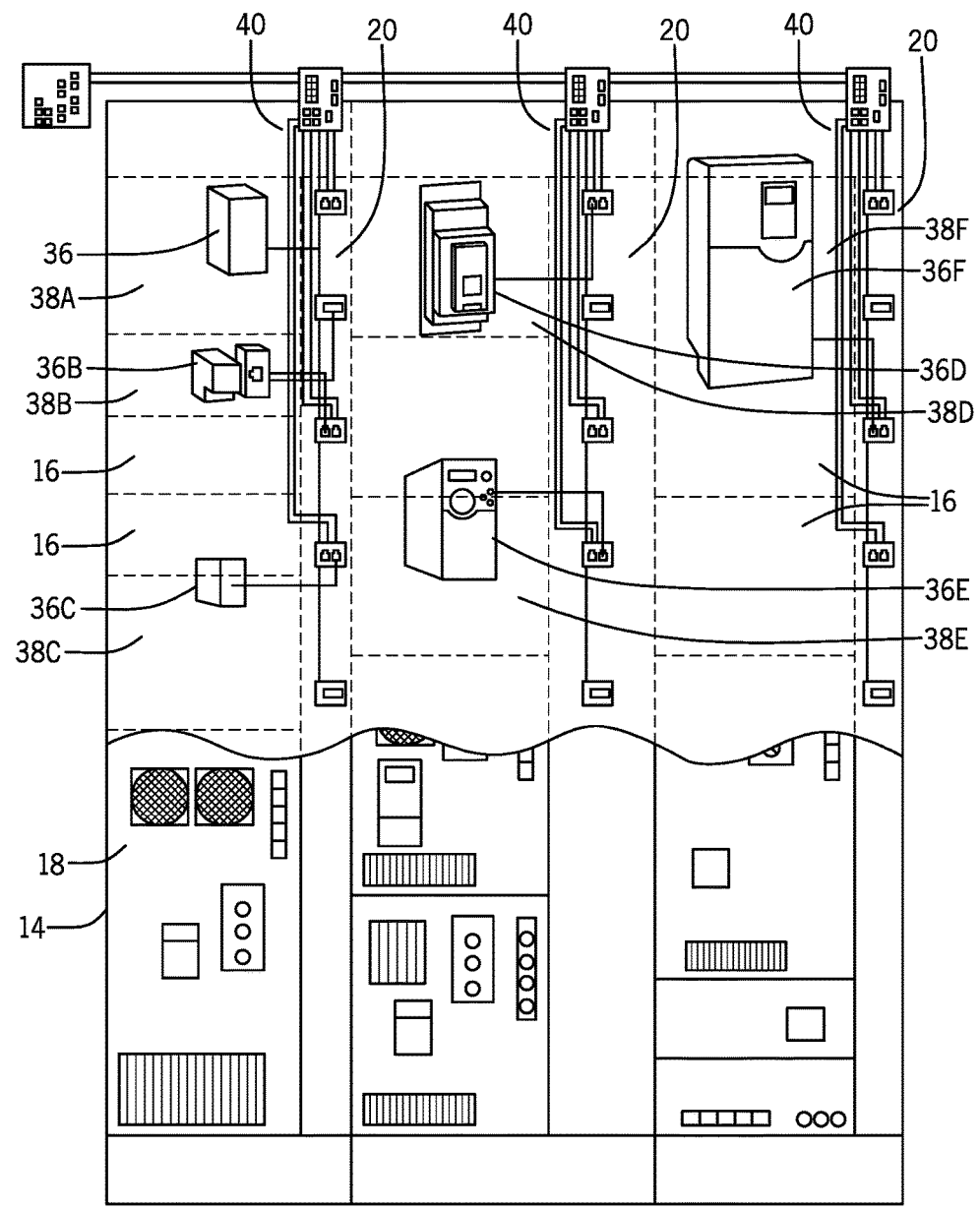
FIG. 2 is a similar representation of an MCC illustrating certain automation components disposed in the MCC enclosure.

FIG. 2 shows the same MCC but with certain internal components located in the bays or individual locations within the enclosure. The components, indicated here by reference numerals 36A through 36F may comprise any suitable automation devices, such as motor drives, relays, contactors, and controllers, just to name a few. Each of these components is disposed in a designated location as indicated by reference numerals 38A through 38F. As noted above, cabling 40 is provided to the components and may be routed through the wireways mentioned above. Where desired, individual wireways may be provided for separating power conductors from lower voltage and data conductors. Many of the components require both power and data cabling, and components such as motor drives will be coupled to receive incoming three-phase power and to output controlled three-phase power for actuators, such as electric motors. Owing to the unique environment of industrial automation and the provision of three-phase power within the enclosure of the MCC, opening and accessing internal volumes in which the bays and components are located is typically limited, and requires special authorization, or even special of clothing and equipment. Accordingly, such access is generally limited to cases of need and only authorized personnel can perform such servicing, which often entails at least temporarily ceasing operation of the MCC and at least partial interruption any process or machine to which it is coupled. The present techniques, therefore, allow for detection, identification, and monitoring of components within the MCC enclosure without the need to open enclosure or access the base or components.

Figure 3:
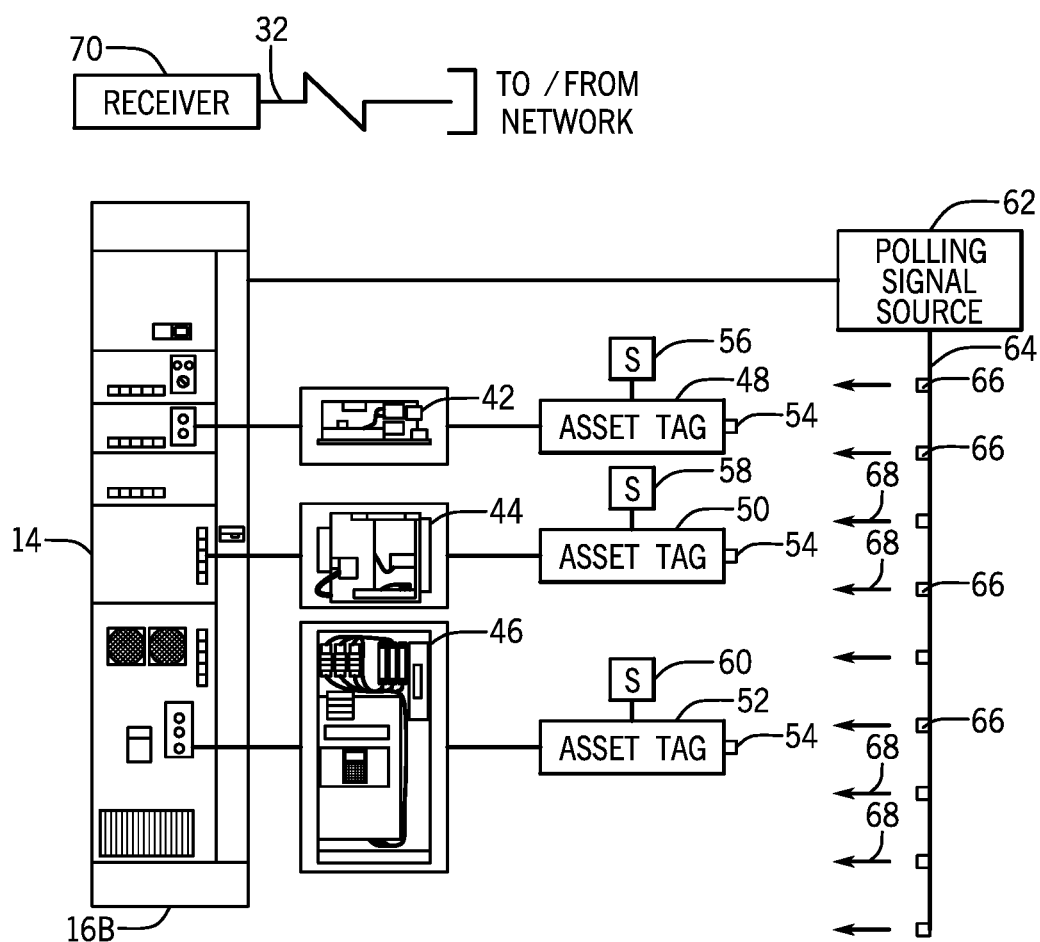
FIG. 3 is a diagrammatical representation of a section of an MCC illustrating how monitoring of the components may be carried out in accordance with aspects of the present disclosure.

FIG. 3 illustrates elements of an MCC component monitoring system of the type that may be applied to one or more MCC's, each having one or more sections. The enclosure 14 illustrated in FIG. 3 has a single section 16B, although again more sections may be provided. Within this section, components 42, 44 and 46 are provided at separate locations or bays. Those skilled in the art will recognize that in a typical MCC each bay may have a size or dimension, sometimes referred to as a form factor adapted to receive the components based upon their size, configuration, and so forth. In the illustrated embodiment, each component is associated with a respective asset tag 48, 50 and 52. The asset tags may utilize any wireless technology, such as radiofrequency transmission. The use of wireless technologies for the asset tags allows data to be transferred to and/or from each asset tag without the need for wiring physically traversing the barrier of the enclosure, or the need for opening the enclosure in any way.

One technology currently contemplated for the asset tags includes the use of another wireless technique for detecting the location of the tag and thereby of the associated component. In the illustrated embodiment, this technology is based upon infrared detection via and infrared receiver, as indicated by reference numeral 54. In practice, the asset tags may be active or passive, though battery-operated active RFID tags are presently contemplated. Such tags will allow for the receipt of infrared signals and processing of the signals to provide data indicative of the identification of the associated component and its location in the MCC. Moreover, it is contemplated that each asset tag may be associated with one or more sensors, as indicated by reference numerals 56, 58 and 60. These sensors may detect and provide various types of information, such as temperature (e.g., indicative of possible overheating of one or more components or of some other malfunction), pressure (e.g., indicative of a change in operation, opening of the enclosure, loss of a seal, etc.), and so forth. Moreover, each asset tag may be linked to the associated component to receive component data, such as information relating to the electrical or mechanical function of the component (e.g., its operating state, voltages, currents, etc.).

The system further includes a polling signal source, as indicated in reference numeral 62. In a currently contemplated embodiment, this source comprises an infrared pulsing source that is coupled to a cable 64. Emitters 66 are positioned along the cable to provide pulsed infrared signals, the pulsing of which correlates to the location along the cable. The signals may be detected by the detectors 54 the asset tags, and thereby provide an indication of the location of the particular asset within the MCC section. Finally, a receiver 70 is positioned to receive signals from the asset tags, such as radiofrequency signals. While the receiver may be placed within the enclosure and coupled to a network 32 through one or more of the wireways of the MCC, in a currently contemplated embodiment, the receiver is positioned outside the enclosure such that access to it does not require the opening of the enclosure.

Figure 4:
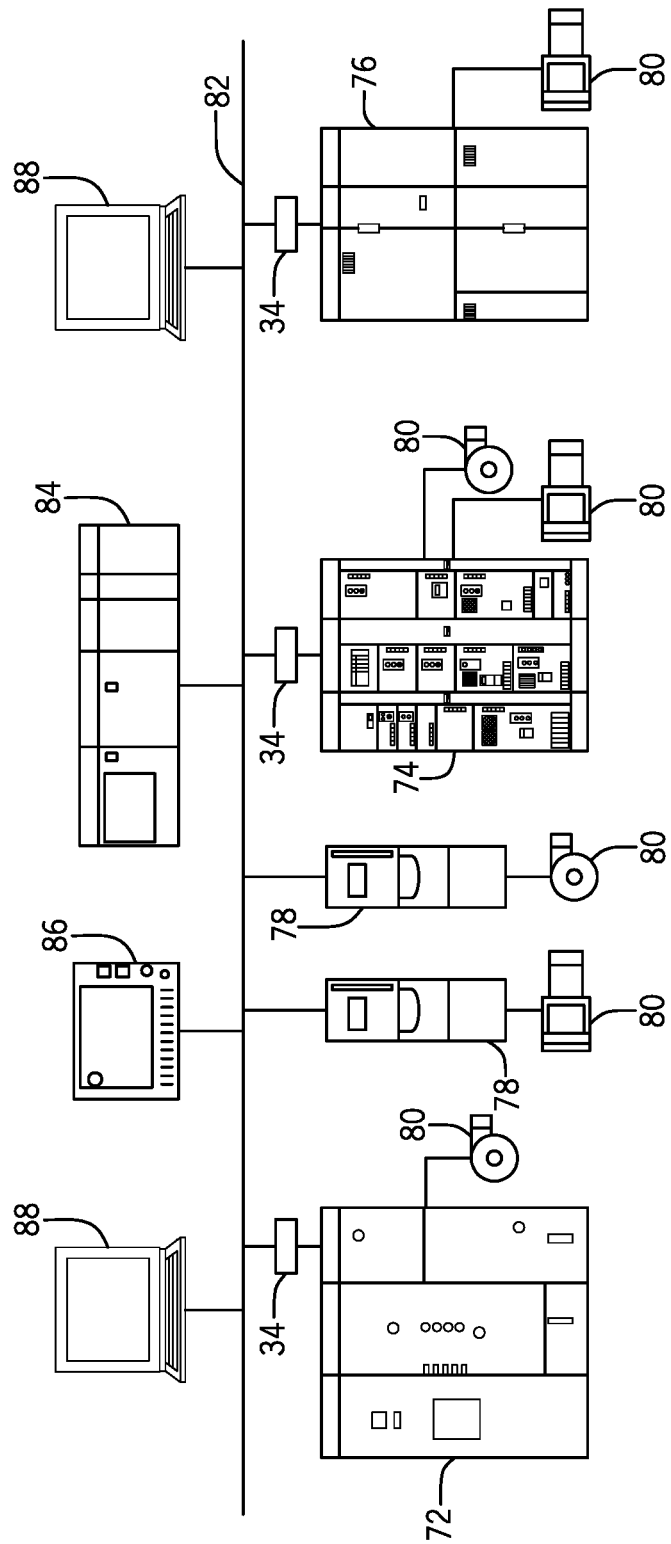
FIG. 4 is a diagrammatical representation of certain networked elements of an automation system including MCC's, and showing how monitored information may be reported, shared, and acted upon.
Figure 5:
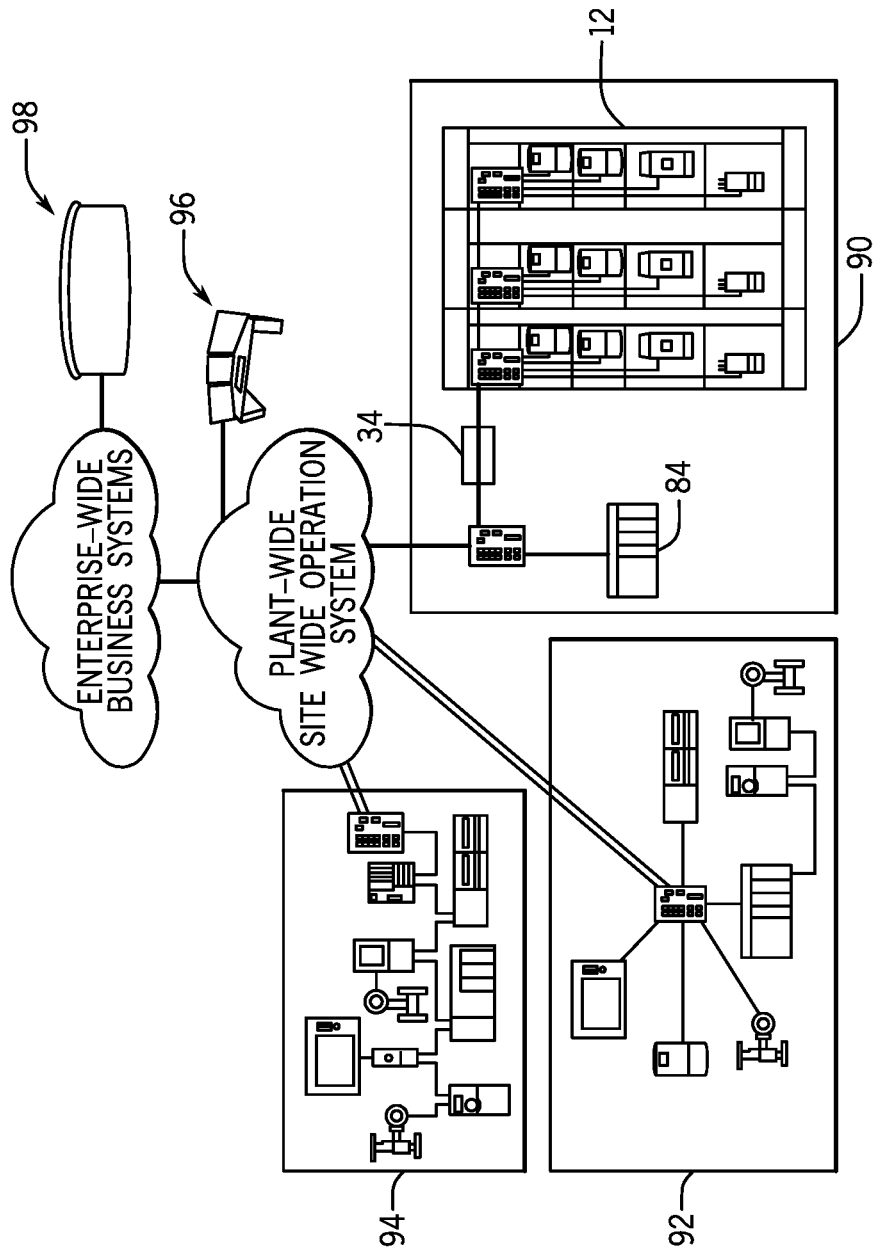
FIG. 5 is a similar diagrammatical representation of how a monitored MCC may be incorporated into an enterprise-wide monitoring scheme.

FIGS. 4 and 5 illustrate MCC's with component monitoring systems in and overall industrial automation environment. In the representation of FIG. 4, for example, three MCC's 72, 74 and 76 are provided along with independent motor controllers or drives 78. The MCC's and these standalone drives are coupled to actuators for the machine or process as indicated by reference numerals 80. Each MCC will have its own components, and typically different components selected and adapted for the control of its respective actuators. Moreover, each MCC is equipped with a component monitoring system 34 of the type described above. These are, in turn, shown coupled to a network 82. Of course, any desired interface circuitry may be included to allow for adapting data to and from the component monitoring systems to the network protocols (e.g., gateways, hubs, servers, etc.). Via the network, the MCC's may be coupled to one another, or to external and remote devices, such as control devices 84 (e.g., rack or rail-mounted automation controllers), human interface modules (HMI's) 86 for viewing aspects of the controlled machine or process as well as for monitoring the MCC components, and workstations 88 where operators may interact with the machine or process, MCC's, the MCC components, and the component monitoring system.

A similar system topography may be used for integrating data from the component monitoring system with additional areas, zones, departments, production lines, supervisory systems, and enterprise systems. FIG. 5 illustrates, for example, an MCC 12 in a first plant zone 90. The MCC is equipped with a component monitoring system 34 of the type described above. Other automation components, such as a control device 84 may be similarly located in the plant zone. Other plant zones 92 and 94 may have other machinery and associated control and monitoring equipment, including, where desired other MCC's. The data from the component monitoring system may be transmitted through a network as discussed above, to additional levels in the installation, such as plant monitoring and control systems, as indicated by reference 96, and enterprise-wide systems, as indicated by reference 98. These may, of course, be of entirely remote from the plant zones, or may be in other areas of the same installation. The overall system, therefore, allows for identification, mapping, and monitoring of not only the MCC's, but their locations in an automated machine a process, a plant, and an enterprise. Automated, semi-automated or manual use cases may allow for "drilling down" through such network links and data to particular components in particular MCC's and determine their identification, their location, their operating state, and so forth.

Figure 6:
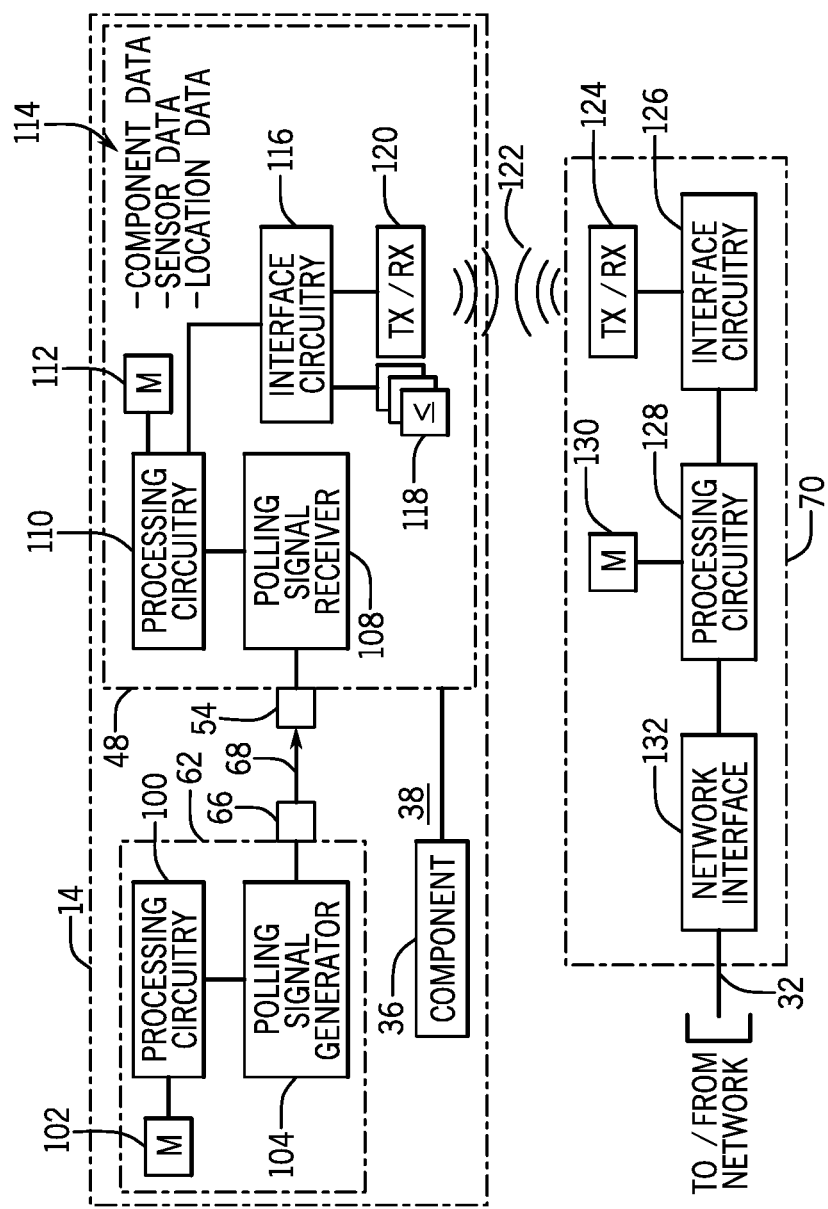
FIG. 6 is a more detailed diagram of certain functional components of an example monitoring system for MCC's.

FIG. 6 illustrates exemplary functional elements of the MCC monitoring system described above. The enclosure 14 houses a number of automation components 36 as described. Within the enclosure, the polling signal source 62 creates pulsed polling signals that are emitted locally near the components by emitters 66, and that are received by the signal detector 54 of each tag 48 associated with each component. Because the signal 68 between the emitter 66 and the detector 54, at least in this embodiment, is line-of-site, reliable location information in the vicinity of the particular emitter is possible. As noted above, the asset tags provide a wireless signal to the receiver 70 which may be located outside of the enclosure 14.

The polling signal source 62 will include circuitry allowing for the generation of the polling signals and for their encoding of position information. In the illustrated embodiment processing circuitry 100 allows for such encoding, and is served by a memory 102 that stores its programming, settings, configuration, and so forth. The processing circuitry may allow for encoding that allows the monitoring system to distinguish between MCC's, and between MCC sections, as well as between locations within an MCC section. A polling signal generator 104 is coupled to the processing circuitry and generates the encoded polling signals that are applied to the emitters.

Each tag, moreover, comprises a polling signal receiver 108 coupled to the detector 54. Processing circuitry 110 allows for processing the polling signal and correlation of the polling signals with a location. It should be noted, however, that in certain embodiments the correlation of the polling signal with the location and thereby with the component may be performed elsewhere, such as in the receiver 70, or even in another device coupled to the receiver via a network. The processing circuitry 110 is associated with memory 112 that stores the program executed by the processing circuitry for receiving, processing and otherwise manipulating the polling signal, accessing additional information regarding the tag and/or component, and for providing this data to the receiver. In a presently contemplated embodiment, for example, the memory circuitry may store component data, such as data identifying the component, the component class, component configuration, component manufacturing data, component service data, and so forth. Sensor data may also be stored in the memory circuitry as it is received from various sensors coupled to the tag and/or to the component, and/or processed by the processing circuitry. Moreover, location data derived from the polling signals may be stored in the memory. Any or all of this data, represented collectively by reference 114, may be accessed and processed for transmission. Interface circuit 116 allows for formatting or packaging of the data. The interface circuitry may also be coupled to one or more sensors 118 to receive and process the sensed data. Transceiver circuitry 120 is coupled to the interface circuitry and allows for the exchange of wireless data is indicated by reference numeral 122.

The receiver 70 comprises a similar transceiver circuitry 124 for exchanging the wireless signals, such as via radio frequency communication. Interface circuit 126 allows for processing such signals. Processing circuitry 128 coordinates receipt and transmission of data, and is served by memory 130. The processing circuitry 128 may, for example, allow for periodic data collection, as well as for remote data queries, processing of received data, at least temporary storing of identification, location, and condition data, and so forth. Network interface 132 may allow for transmission of this data to remote devices as discussed above, as well as for the receipt of data queries, configuration, and so forth.

Figure 7:
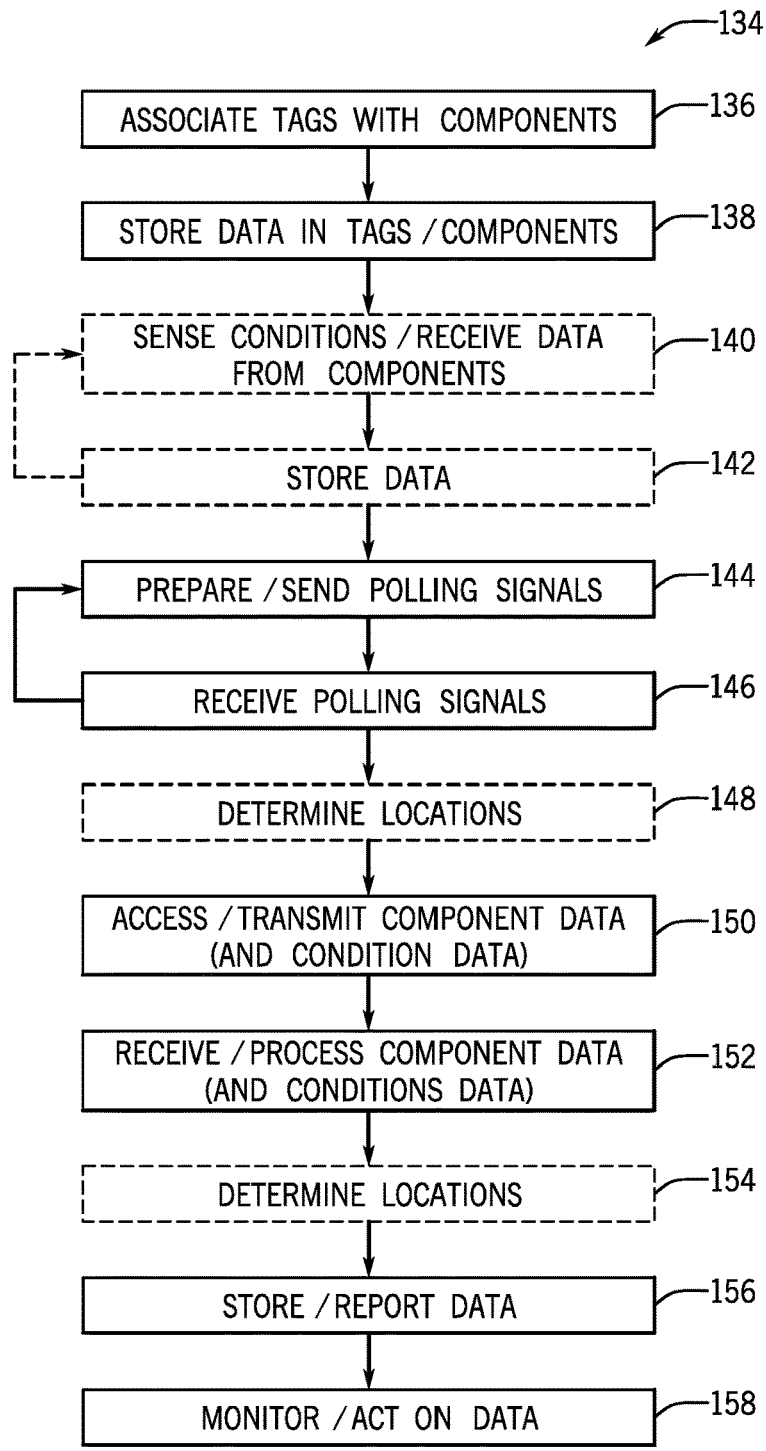
FIG. 7 is a flow chart illustrating certain example steps in logic for monitoring MCC components.

FIG. 7 illustrates steps in example logic for carrying our MCC component monitoring via a system of the type described above. The process 134 may typically begin with the associate of the asset or component tags with the components of the MCC. In some applications this can be done at the time of building or commissioning of the MCC, particularly for new installations. However, it should be noted that the use of the disclosed technologies is not limited to new applications, but some or all of the elements can be retrofitted to existing MCC's. In general, any number of tags may be used, particularly for more critical components or those that may require monitoring or servicing. The association may entail affixing the tags to the components, such as adhesively, or with a mechanical means (e.g., clips, fasteners, straps, etc.). Moreover, where the tags are designed to connect to or receive data from the associated components, connections may be made at this stage, and any configuration for data exchange may be established. At step 138, then, data is stored in the tags. As discussed above, such data may include any desired identification of the components, their model or serial numbers, classes, manufacturer information, service information, and so forth. These two steps may also include connecting or associating the tags with any external sensors, or in some cases the tags themselves may include integrated sensing devices (e.g., for temperature).

During use, then, at steps 140 and 142, data may be sensed and/or received by the tags either from any sensors present, or from the associated components. These steps may be repeated on any desired basis, such as for periodic updating of the data. Alternatively, the sensors, the components, and/or the tags may be configured to update such information upon the occurrence of a pre-set event, such as a change in state, or a threshold (e.g., of temperature, pressure, etc.).

At step 144, polling signals are prepared and sent by the polling source and emitters. Again, these signals are encoded to permit localization of the MCC component by reference to the vicinity of the emitters. At step 146 these signals are received by the tags. Because the polling signals are encoded by location, then, the location of each tagged component may be determined at step 148. It should be noted that this step is shown as optional at this stage because the tags themselves may be configured to determine such locations, or the polling signals or data derived from the polling signals may be stored and the location determination may be made later or by a downstream system element (such as the receiver or a computer, HMI, workstation, or another system element coupled to the receiver via a network).

At step 150 the component and any condition data (e.g., from the monitored component or any sensors present) may be accessed, and transmitted. In presently contemplated embodiments this may be done on a periodic basis, on an event-driven basis, or when prompted by the receiver or any connected device. Such "push" and "pull" arrangements may be available in the configuration of the tags and receiver, where desired. At step 152 the data is received and processed by the receiver. Here again, the data may be stored for later reference, and is available for reporting to remote systems and components. At step 154, the receiver and/or any other networked system device may determine the locations of the tagged MCC components by reference to the polling data or data derived from it. This information will be associated with any identifying data, component information, and sensed data where such information is stored and available.

At step 158, then, the data acquired by the system may be acted upon. Many different scenarios may be envisioned for such actions. For example, the system may be used simply to map the location of components in bays and sections of MCC's when needed, such as for servicing. Further, periodic acquisition of data may allow for continuous monitoring of component and system health. Still further, when any detected data warrants warnings, alerts, or event-driven servicing, the processing by the tags, the receiver, or any downstream systems may produce such warnings or alerts that may be logged, messaged, or otherwise provided to automated or semi-automated systems, or that may result in actions by operations or maintenance personnel.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor control center system comprising:
   an enclosure having multiple internal units covered by one or more doors;
   automation components located and interconnected in the internal units and provided with power and data connections for receiving input power and providing output power to one or more motors;
   a polling system disposed in the enclosure and configured to output polling signals;
   a plurality of asset tags associated with the automation components and responsive to the polling signals, each asset tag storing data indicative of the respective associated automation component, the asset tags being configured to output component data signals indicative of the stored data and location data derived from the polling signals; and a receiver that, in operation, receives the component data signals from the asset tags.

2. The system of claim 1, wherein the polling system comprises an infrared controller and infrared signal transmitters.

3. The system of claim 1, wherein the asset tags comprise radiofrequency tags that output radiofrequency signals containing data indicative of location of the respective associated automation component based upon the polling signals.

4. The system of claim 3, wherein the receiver comprises a radiofrequency receiver located outside the enclosure.

5. The system of claim 1, wherein the receiver is configured to be coupled to a network to provide system data indicative of the component data of each automation component.

6. The system of claim 5, comprising sensors configured to detect conditions of the automation components and to transmit condition data representative thereof to the receiver.

7. The system of claim 6, wherein the sensors are integrated with the asset tags.

8. The system of claim 6, wherein the condition data comprises at least one of temperature, pressure, or electrical parameters.

9. A motor control center system comprising:
an enclosure having multiple internal units covered by one or more doors;
automation components located and interconnected in the internal units and provided with power and data connections for receiving input power and providing output power to one or more motors;
a wireless polling system disposed in the enclosure and configured to output polling signals corresponding to locations within the enclosure;
a plurality of wireless asset tags associated with the automation components and responsive to the polling signals, each asset tag storing data indicative of the respective associated automation component, the asset tags being configured to wirelessly output component data signals indicative of the stored data and location data derived from the polling signals; and
a wireless receiver disposed outside the enclosure that, in operation, receives the output component data signals from the asset tags and provides the component data or data derived from the component data to a remote monitoring system via a network.

10. The system of claim 9, wherein the polling system comprises an infrared controller and infrared signal transmitters.

11. The system of claim 9, wherein the asset tags comprise radiofrequency tags that output radiofrequency signals containing data indicative of location of the respective associated automation component based upon the polling signals.

12. The system of claim 9, comprising sensors configured to detect conditions of the automation components and to transmit condition data representative thereof to the receiver.

13. The system of claim 12, wherein the sensors are integrated with the asset tags.

14. The system of claim 12, wherein the condition data comprises at least one of temperature, pressure, or electrical parameters.

15. A motor control center method comprising:
wirelessly outputting polling signals corresponding to locations within a motor control center enclosure, the enclosure having multiple internal units covered by one or more doors and automation components located and interconnected in the internal units and provided with power and data connections for receiving input power and providing output power to one or more motors, the automation components being associated with respective wireless asset tags associated with the respective automation components and responsive to the polling signals;
in response to the polling signals wirelessly outputting from the wireless asset tags component data signals indicative of the stored data and location data derived from the polling signals;
wirelessly receiving the output component data signals via a receiver disposed outside the enclosure; and
providing the component data or data derived from the component data to a remote monitoring system via a network.

16. The method of claim 15, wherein the polling is performed via an infrared controller and infrared signal transmitters.

17. The method of claim 15, wherein the asset tags output radiofrequency signals containing data indicative of location of the respective associated automation component based upon the polling signals.

18. The method of claim 15, comprising sensing conditions of the automation components and transmitting condition data representative thereof to the receiver.

19. The method of claim 18, wherein the sensors are integrated with the asset tags.

20. The method of claim 18, wherein the condition data comprises at least one of temperature, pressure, or electrical parameters.

* * * * *